(12) United States Patent
Shimizu et al.

(10) Patent No.: US 10,217,811 B1
(45) Date of Patent: Feb. 26, 2019

(54) SEMICONDUCTOR DEVICE, METHOD FOR MANUFACTURING SEMICONDUCTOR DEVICE, INVERTER CIRCUIT, DRIVING DEVICE, VEHICLE, AND ELEVATOR

(71) Applicant: Kabushiki Kaisha Toshiba, Minato-ku (JP)

(72) Inventors: Tatsuo Shimizu, Shinagawa (JP); Ryosuke Iijima, Setagaya (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/892,554

(22) Filed: Feb. 9, 2018

(30) Foreign Application Priority Data

Aug. 25, 2017 (JP) .................................. 2017-161712

(51) Int. Cl.
| | | |
|---|---|---|
| *H01L 29/04* | (2006.01) | |
| *H01L 29/16* | (2006.01) | |
| *H01L 29/36* | (2006.01) | |
| *H01L 29/78* | (2006.01) | |
| *H01L 29/417* | (2006.01) | |
| *H01L 21/04* | (2006.01) | |

(Continued)

(52) U.S. Cl.
CPC ........ *H01L 29/04* (2013.01); *H01L 21/02164* (2013.01); *H01L 21/02271* (2013.01); *H01L 21/02318* (2013.01); *H01L 21/049* (2013.01); *H01L 21/0465* (2013.01); *H01L 29/045* (2013.01); *H01L 29/063* (2013.01); *H01L 29/0619* (2013.01); *H01L 29/0696* (2013.01); *H01L 29/1095* (2013.01); *H01L 29/1608* (2013.01); *H01L 29/36* (2013.01); *H01L 29/41741* (2013.01); *H01L 29/66068* (2013.01); *H01L 29/66325* (2013.01); *H01L 29/66333* (2013.01); *H01L 29/7395* (2013.01); *H01L 29/7811* (2013.01); *H01L 21/0274* (2013.01); *H01L 21/02378* (2013.01); *H01L 21/02529* (2013.01); *H01L 21/02634* (2013.01); *H01L 29/0865* (2013.01); *H01L 29/167* (2013.01); *H01L 29/42364* (2013.01); *H01L 29/45* (2013.01); *H01L 29/4916* (2013.01)

(58) Field of Classification Search
CPC ............ H01L 29/0696; H01L 29/1095; H01L 29/66325; H01L 29/66333; H01L 29/6634; H01L 29/66348; H01L 29/7393; H01L 29/7395; H01L 29/7396; H01L 29/7397

See application file for complete search history.

(56) References Cited

U.S. PATENT DOCUMENTS

| | | |
|---|---|---|
| 8,624,264 B2 | 1/2014 | Shimizu et al. |
| 9,324,826 B2 | 4/2016 | Shimizu et al. |

(Continued)

FOREIGN PATENT DOCUMENTS

| | | |
|---|---|---|
| JP | 2012-164788 | 8/2012 |
| JP | 2012-186324 | 9/2012 |

(Continued)

*Primary Examiner* — Eduardo A Rodela
(74) *Attorney, Agent, or Firm* — Oblon, McClelland, Maier & Neustadt, L.L.P.

(57) ABSTRACT

A semiconductor device according to an embodiment includes a silicon carbide layer having a front surface inclined at 0° or more and 10° or less with respect to a (0001) face, a silicon oxide layer, and a region located between the front surface and the silicon oxide layer and having the number of carbon-carbon single bonds larger than the number of carbon-carbon double bonds.

17 Claims, 12 Drawing Sheets

(51) Int. Cl.
  H01L 29/10   (2006.01)
  H01L 29/06   (2006.01)
  H01L 29/66   (2006.01)
  H01L 29/739  (2006.01)
  H01L 21/02      (2006.01)
  H01L 29/167     (2006.01)
  H01L 29/08      (2006.01)
  H01L 29/423     (2006.01)
  H01L 29/49      (2006.01)
  H01L 29/45      (2006.01)
  H01L 21/027     (2006.01)

(56) References Cited

U.S. PATENT DOCUMENTS

| | | |
|---|---|---|
| 9,748,343 B2 | 8/2017 | Shimizu et al. |
| 2012/0199846 A1 | 8/2012 | Shimizu et al. |
| 2012/0228630 A1 | 9/2012 | Shimizu et al. |
| 2017/0033185 A1 | 2/2017 | Shimizu et al. |

FOREIGN PATENT DOCUMENTS

| | | |
|---|---|---|
| JP | 2014-078727 | 5/2014 |
| JP | 2015-146450 | 8/2015 |
| JP | 2017-034003 | 2/2017 |

SEMICONDUCTOR DEVICE, METHOD FOR MANUFACTURING SEMICONDUCTOR DEVICE, INVERTER CIRCUIT, DRIVING DEVICE, VEHICLE, AND ELEVATOR

CROSS-REFERENCE TO RELATED APPLICATION

This application is based upon and claims the benefit of priority from Japanese Patent Application No. 2017-161712, filed on Aug. 25, 2017, the entire contents of which are incorporated herein by reference.

FIELD

Embodiments described herein relate generally to a semiconductor device, a method for manufacturing a semiconductor device, an inverter circuit, a driving device, a vehicle, and an elevator.

BACKGROUND

Silicon carbide (SiC) is expected as a material for the next generation semiconductor device. The silicon carbide has excellent physical properties such as a band gap about three times larger, breakdown field strength about ten times larger, and thermal conductivity about three times larger than silicon (Si). By utilizing these characteristics, it is possible to realize a semiconductor device which can be operated with low loss and high temperature.

However, for example, when a metal oxide semiconductor field effect transistor (MOSFET) is formed using the silicon carbide, there is a problem in that carrier mobility is low.

DETAILED DESCRIPTION

Figure 1:
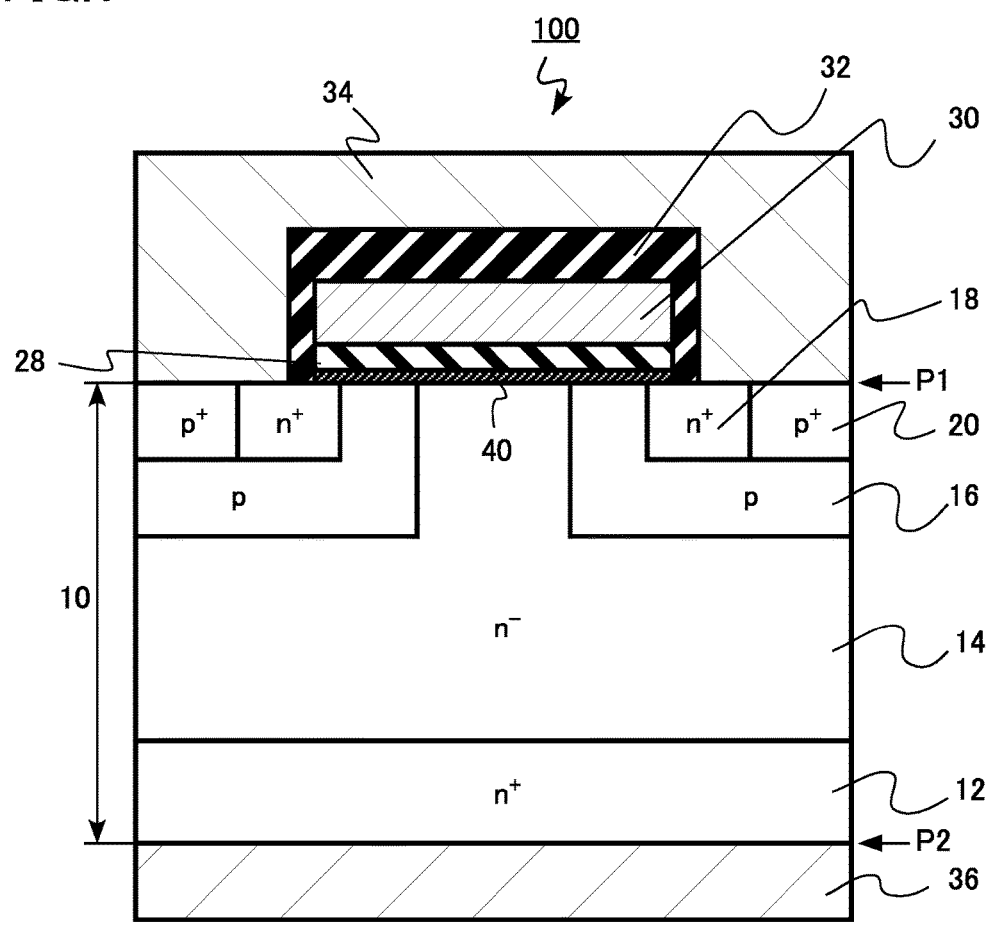
FIG. 1 is a schematic cross-sectional view of a semiconductor device according to a first embodiment.

A semiconductor device according to an embodiment includes a silicon carbide layer having a front surface inclined at 0° or more and 10° or less with respect to a (0001) face, a silicon oxide layer, and a region located between the front surface and the silicon oxide layer and having the number of carbon-carbon single bonds larger than the number of carbon-carbon double bonds.

Hereinafter, embodiments of the present disclosure will be described with reference to the accompanying drawings. It should be noted that in the following description, the same or similar parts are denoted by the same reference numerals and the like, and the description of the parts described once or the like is omitted appropriately.

In the following description, notations of $n^+$, n, and $n^-$ and $p^+$, p, and $p^-$ represent a relatively higher impurity concentration or a relatively lower impurity concentration in each conductivity type. In other words, $n^+$ represents an n-type impurity concentration relatively higher than that of n, and n represents an n-type impurity concentration relatively lower than that of n. In addition, $p^+$ represents a p-type impurity concentration relatively higher than that of p, and $p^-$ represents a p-type impurity concentration relatively lower than that of p. It should be noted that the $n^+$ type and the $n^-$ type may be simply described as an n type and the $p^+$ type and the $p^-$ type may be simply described as a p type.

First Embodiment

A semiconductor device according to the first embodiment includes a silicon carbide layer having a first plane and a second plane, the first plane being inclined at 0° or more and 10° or less with respect to a (0001) face, a first electrode contacting the first plane, a second electrode contacting the second plane, a first-conductivity type first semiconductor region located in the silicon carbide layer, a second-conductivity type second semiconductor region located between the first semiconductor region and the first plane, a first-conductivity type third semiconductor region located between the second semiconductor region and the first plane, a gate electrode, a silicon oxide layer located between the second semiconductor region and the gate electrode, and a region located between the second semiconductor region and the silicon oxide layer and having the number of carbon-carbon single bonds larger than the number of carbon-carbon double bonds.

FIG. 1 is a schematic cross-sectional view showing a MOSFET which is the semiconductor device according to the first embodiment. A MOSFET 100 is a double implantation MOSFET (DIMOSFET) in which a p well and a source region are formed by ion implantation. In addition, the MOSFET 100 is an n channel type MOSFET using an electron as a carrier.

The MOSFET 100 includes a silicon carbide layer 10, a drain region 12, a drift region 14 (first semiconductor region), a p-well region 16 (second semiconductor region), a source region 18 (third semiconductor region), a p-well contact region 20, an interface region 40 (region), a silicon oxide layer 28, a gate electrode 30, an interlayer insulating film 32, a source electrode 34 (first electrode), and a drain electrode 36 (second electrode).

The silicon carbide layer 10 is single crystal SiC. The silicon carbide layer 10 is, for example, 4H—SiC.

The silicon carbide layer 10 has a first plane (front surface) and a second plane (back surface). The front surface of the silicon carbide layer 10 is the surface inclined at 0° or more and 10° or less with respect to the (0001) face. The (0001) face is referred to as a silicon face. The back surface of the silicon carbide layer 10 is a surface inclined at 0° or more and 10° or less with respect to a (000-1) face. The (000-1) face is referred to as a carbon face.

The front surface of the silicon carbide layer 10 is, for example, a surface inclined at 0° or more and 8° or less with respect to the (0001) face. The front surface of the silicon carbide layer 10 is, for example, a surface inclined at 0° or more and 5° or less with respect to the (0001) face.

The drain region 12 is, for example, $n^+$-type SiC. The drain region 12 includes, for example, nitrogen (N) as an n-type impurity. The n-type impurity concentration of the drain region 12 is, for example, $1 \times 10^{18}$ cm$^{-3}$ or more and $1 \times 10^{20}$ cm$^{-3}$ or less.

The drift region 14 is provided on the drain region 12. The drift region 14 is $n^-$-type SiC. The drift region 14 includes, for example, nitrogen as an n-type impurity.

The n-type impurity concentration of the drift region 14 is, for example, $5 \times 10^{15}$ cm$^{-3}$ or more and $2 \times 10^{16}$ cm$^{-3}$ or less. The drift region 14 is, for example, an epitaxial growth layer of the SiC formed on the drain region 12 by an epitaxial growth. A thickness of the drift region 14 is, for example, 5 µm or more and 100 µm or less.

The p-well region 16 is provided on a part of the surface of the drift region 14. The p-well region 16 is p-type SiC. The p-well region 16 includes, for example, aluminum (Al) as a p-type impurity. The p-type impurity concentration of the p-well region 16 is, for example, $5 \times 10^{15}$ cm$^{-3}$ or more and $1 \times 10^{17}$ cm$^{-3}$ or less.

A depth of the p-well region 16 is, for example, 0.4 µm or more and 0.8 µm or less. The p-well region 16 serves as a channel region of the MOSFET 100.

A surface of the p-well region 16 is a surface inclined at 0° or more and 10° or less with respect to the silicon face.

The source region 18 is provided on apart of the surface of the p-well region 16. The source region 18 is the $n^+$-type SiC. The source region 18 includes, for example, phosphorus (P) as the n-type impurity. The n-type impurity concentration of the source region 18 is, for example, $1 \times 10^{18}$ cm$^{-3}$ or more and $1 \times 10^{22}$ cm$^{-3}$ or less.

A depth of the source region 18 is shallower than that of the p-well region 16. The depth of the source region 18 is, for example, 0.2 µm or more and 0.4 µm or less.

The well contact region 20 is provided on a part of the surface of the p-well region 16. The well contact region 20 is provided on a side of the source region 18. The well contact region 20 is the $p^+$-type SiC.

The well contact region 20 includes, for example, aluminum as the p-type impurity. The p-type impurity concentration of the well contact region 20 is, for example, $1 \times 10^{18}$ cm$^{-3}$ or more and $1 \times 10^{22}$ cm$^{-3}$ or less.

A depth of the p-well contact region 20 is shallower than that of the p-well region 16. The depth of the p-well contact region 20 is, for example, 0.2 µm or more and 0.4 µm or less.

The silicon oxide layer 28 is provided between the p-well region 16 and the gate electrode 30 and between the drift region 14 and the gate electrode 30.

A thickness of the silicon oxide layer 28 is, for example, 20 nm or more and 150 nm or less. The silicon oxide layer 28 serves as a gate insulating layer of the MOSFET 100.

The interface region 40 is located between the p-well region 16 and the silicon oxide layer 28 and between the drift region 14 and the silicon oxide layer 28.

A carbon (C)-carbon (C) bond exists in the interface region 40. The number of carbon-carbon single bonds in the interface region 40 is larger than the number of carbon-carbon double bonds in the interface region 40. The carbon-carbon double bond may not exist in the interface region 40. The interface region 40 is in contact with the silicon oxide layer 28 but does not belong to the silicon oxide layer 28.

It is determined which of the number of carbon-carbon single bonds and the number of carbon-carbon double bonds more exists in the interface region 40 by comparing the count number of photoelectrons due to the carbon-carbon single bond with the count number of photoelectrons due to the carbon-carbon double bond using, for example, X-ray photoelectron spectroscopy (XPS).

It can be determined which of the number of carbon-carbon single bonds and the number of carbon-carbon double bonds more exists in the interface region 40, for example, even by infrared spectroscopy and Raman spectroscopy.

In addition, a bond between carbon and a first termination element (first element) exists in the interface region 40. The first termination element is, for example, oxygen (O), sulfur (S), selenium (Se), or tellurium (Te). In addition, the first termination element is, for example, hydrogen (H), deuterium (D), or fluorine (F).

A structure in which one first termination element selected from the group consisting of, for example, oxygen (O), sulfur (S), selenium (Se), and tellurium (Te) is shared by and bonded to two single-bonded carbons exists in the interface region 40. In other words, a structure in which the same one first termination element is bonded to both of the two single-bonded carbons exists in the interface region 40.

A structure in which a first termination element selected from the group consisting of, for example, hydrogen (H), deuterium (D), and fluorine (F) is bonded to each of the two single-bonded carbons one by one exists in the interface region 40.

The existence of the bond between the carbon and the first termination element can be confirmed, for example, by the X-ray photoelectron spectroscopy. In addition, the existence of the bond between the carbon and the first termination element can be determined even by, for example, the infrared spectroscopy and the Raman spectroscopy.

Figure 2A:
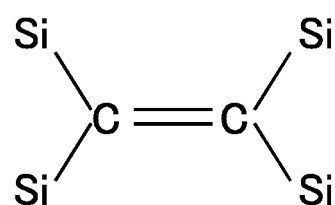
FIGS. 2A, 2B, 2C and 2D are diagrams for explaining an interface region according to the first embodiment.
Figure 2B:
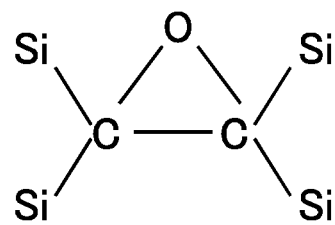
Figure 2C:
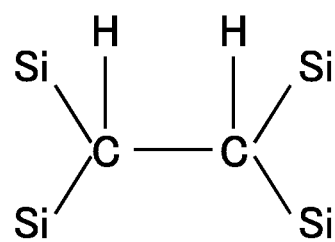
Figure 2D:
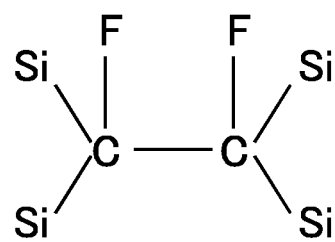

FIGS. 2A, 2B, 2C and 2D are diagrams for explaining the interface region according to the first embodiment. FIG. 2 is a diagram showing a bonded state of the carbon in the interface region 40. FIG. 2A is a diagram showing the carbon-carbon double bond. FIGS. 2B, 2C and 2D are diagrams showing the carbon-carbon single bond.

In the case of the carbon-carbon double bond shown in FIG. 2A, two carbons are bonded by one σ bond and one π bond.

FIG. 2B shows the case where the single-bonded carbon is bonded to oxygen. In other words, it shows the case where the first termination element is oxygen. A cyclic structure of C—O—C is created by two carbons and one oxygen. In other words, it is a structure in which one oxygen is bonded to both of the two single-bonded carbons. In other words, the π bond of the double bond is terminated by oxygen and disappears. The first termination element acquires the same bonded state even in the case of sulfur (S), selenium (Se), and tellurium (Te) which are the same group 16 elements as oxygen (O).

FIG. 2C shows the case where the single-bonded carbon is bonded to hydrogen. It shows a structure in which hydrogen is bonded to each of the two single-bonded carbons one by one. The π bond of the double bond is terminated by hydrogen and disappears. It goes the same for even deuterium.

FIG. 2D shows the case where the single-bonded carbon is bonded to fluorine. It shows a structure in which one fluorine is bonded to each of the two single-bonded carbons. The π bond of the double bond is terminated by fluorine and disappears.

FIGS. 2A, 2B, 2C, and 2D illustrate a structure in which two silicons are bonded to each of the two single-bonded or two double-bonded carbons, but there may be a structure in which instead of the silicon, for example, oxygen is bonded to the carbons. The two carbons are bonded to at least one silicon on the front surface of the silicon carbide layer 10 (single crystal substrate). There may be a structure in which oxygen enters between carbon and silicon on the front surface of the silicon carbide layer, that is, a structure in which carbon is bonded to the silicon on the front surface of the silicon carbide layer 10 via oxygen.

Figure 3:
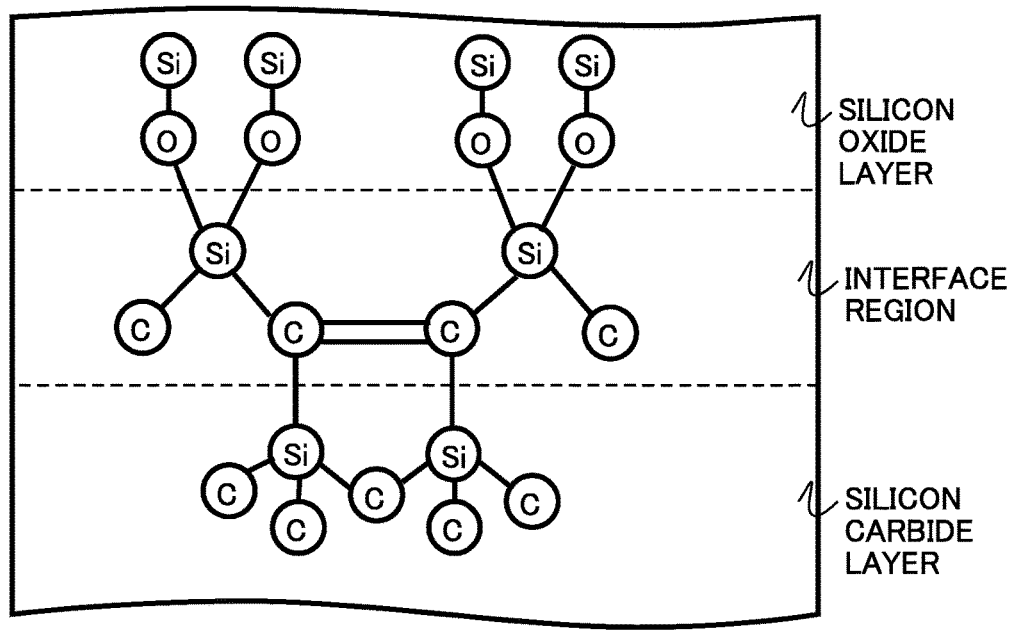
FIG. 3 is a schematic cross-sectional view of a part of the semiconductor device according to the first embodiment.
Figure 4:
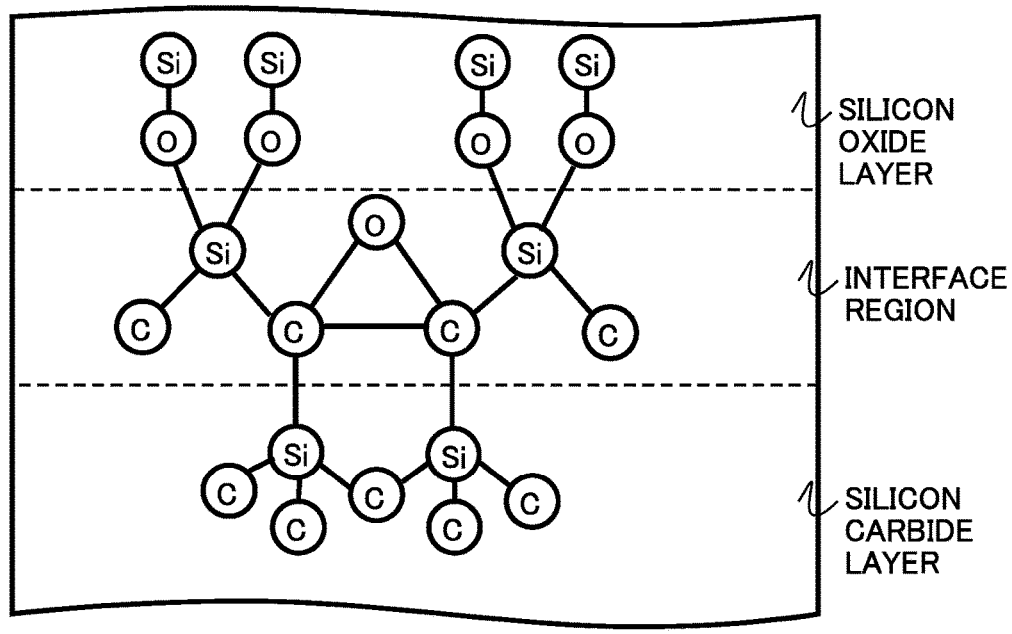
FIG. 4 is a schematic cross-sectional view of a part of the semiconductor device according to the first embodiment.

FIGS. 3 and 4 are schematic cross-sectional views of a part of the semiconductor device according to the first embodiment. FIGS. 3 and 4 schematically show an example of the bonded state of the silicon, the carbon, and the oxygen in the vicinity of the interface region 40.

FIG. 3 shows the case where the carbon-carbon bond in the interface region 40 is the double bond, and FIG. 4 shows the case where the carbon-carbon bond in the interface region 40 is the single bond.

In the interface region 40, the two carbon-carbon bonds which are bonded to silicon on an outermost front surface of the silicon carbide layer are the double bond in FIG. 3 and the single bond in FIG. 4. The two carbon-carbon bonds are disposed in a direction generally parallel to the front surface of the silicon carbide layer. This is because the generated carbons are bonded as a result that two carbons forming an SiC bilayer on the outermost surface are bonded. If there are two carbons disposed in parallel to the surface, it was found that it is difficult for oxygen to diffuse into the inside of the substrate (silicon carbide layer). As a result, oxidation resistance of the surface of the substrate is improved. There may be the case where oxidation may not be performed with regard to a portion where there is a cap due to two carbons, even at the temperature at which the substrate is oxidized.

The gate electrode 30 is provided on the silicon oxide layer 28. The silicon oxide layer 28 is provided between the gate electrode 30 and the interface region 40.

For example, polycrystalline silicon including an n-type impurity or a p-type impurity can be applied to the gate electrode 30.

The interlayer insulating film 32 is formed on the gate electrode 30. The interlayer insulating film 32 is, for example, a silicon oxide film.

The source electrode 34 is electrically connected to the source region 18 and the p-well contact region 20. The source electrode 34 also serves as the p-well electrode for applying a potential to the p-well region 16. The source electrode 34 is in contact with the silicon carbide layer 10.

The source electrode 34 is formed by laminating, for example, a barrier metal layer of nickel (Ni) and a metal layer of aluminum on the barrier metal layer. It does not matter that the barrier metal layer of nickel and the silicon carbide layer react to each other to form nickel silicide ($NiSi$, $Ni_2Si$ or the like). The barrier metal layer of nickel and the metal layer of aluminum may react to each other to form an alloy.

The drain electrode 36 is electrically connected to the drain region 12. The drain electrode 36 is provided on a back surface of the silicon carbide layer 10. The drain electrode 36 is in contact with the silicon carbide layer 10.

The drain electrode 36 is, for example, nickel. It does not matter that the nickel may react with the silicon carbide layer 10 to form nickel silicide ($NiSi$, $Ni_2Si$ or the like).

In the first embodiment, the n-type impurity is, for example, nitrogen or phosphorus. It is possible to apply arsenic (As) or antimony (Sb) as the n-type impurity.

In addition, in the first embodiment, the p-type impurity is, for example, aluminum. It is possible to apply boron (B), gallium (Ga), indium (In) as the p-type impurity.

Next, a method for manufacturing a semiconductor device according to the first embodiment will be described. Hereinafter, the case where the first termination element is oxygen will be described as an example.

The method for manufacturing a semiconductor device according to the first embodiment includes forming a silicon oxide layer on a front surface of a silicon carbide layer having a front surface inclined at 0° or more and 10° or less with respect to a (0001) face and performing first heat treatment at a partial pressure of ozone of 10% or less or a partial pressure of oxygen radical of 10% or less, and a temperature of 400° C. or less.

Figure 5:
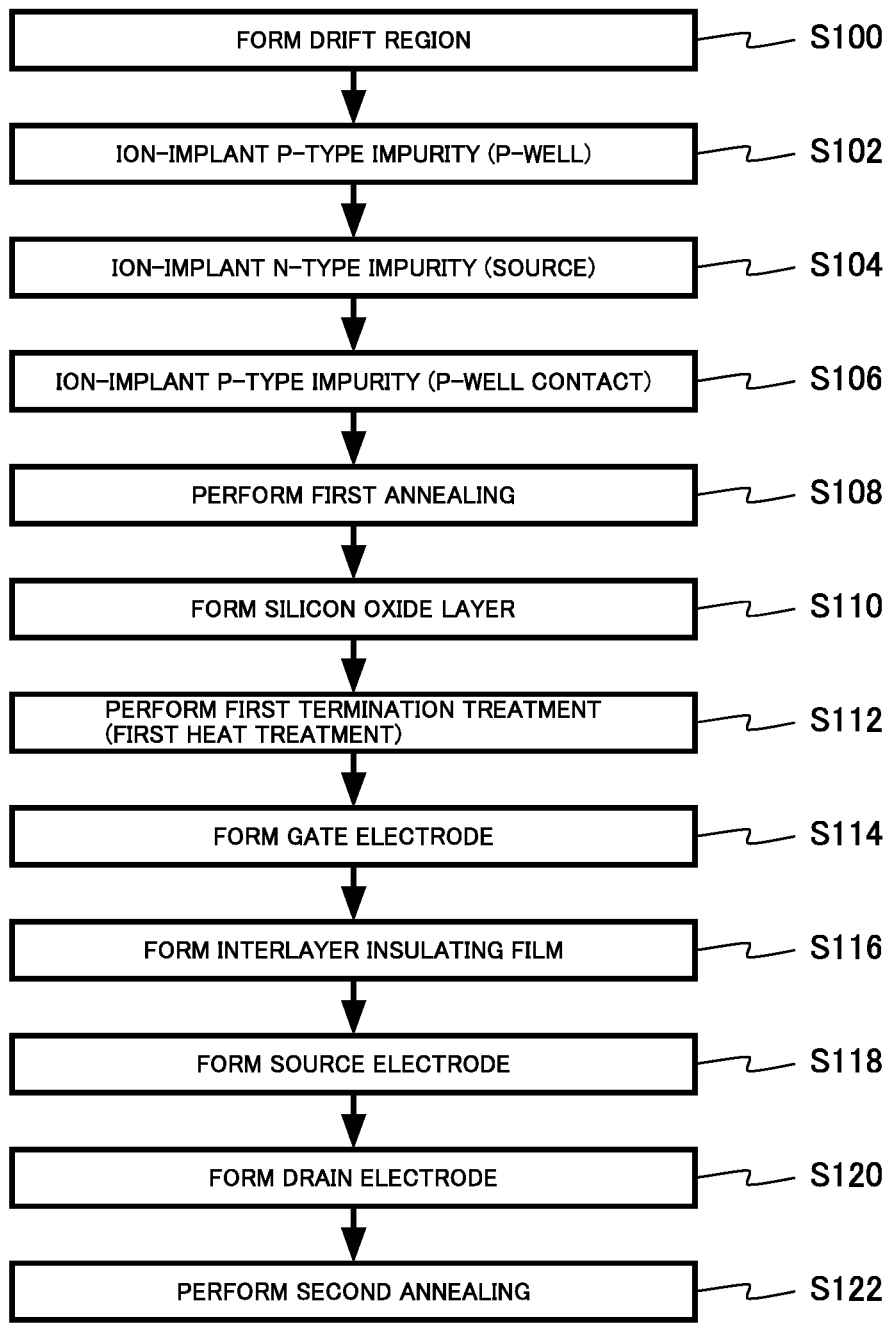
FIG. 5 is a process flow of a method for manufacturing a semiconductor device according to the first embodiment.

FIG. 5 is a process flow chart of the method for manufacturing a semiconductor device according to the first embodiment.

As shown in FIG. 5, the method for manufacturing a semiconductor device includes forming a drift region (step S100), ion-implanting a p-type impurity (step S102), ion-implanting an n-type impurity (step S104), ion-implanting a p-type impurity (step S106), performing first annealing (step S108), forming a silicon oxide layer (step S110), performing first termination treatment (first heat treatment) (step S112), forming a gate electrode (step S114), forming an interlayer insulating film (step S116), forming a first electrode (step S118), forming a second electrode (step S120), and performing second annealing (step S122).

First of all, an n$^+$-type silicon carbide wafer W is prepared. The silicon carbide wafer W is, for example, a single crystal of 4H—SiC. The silicon carbide wafer W corresponds to the drain region 12.

The silicon carbide wafer W includes nitrogen as an n-type impurity. The n-type impurity concentration of the silicon carbide wafer W is, for example, $1\times10^{18}$ cm$^{-3}$ or more and $1\times10^{20}$ cm$^{-3}$ or less. A thickness of the silicon carbide wafer W is, for example, 350 μm. The silicon carbide wafer W may be thinned to about 90 μm before forming the drain electrode 36 on the back surface thereof.

In step S100, the drift region 14 is formed on the silicon face of the silicon carbide wafer W by epitaxial growth. The drift region 14 is a single crystal of 4H—SiC.

The drift region 14 includes, for example, nitrogen as an n-type impurity. The n-type impurity concentration of the drift region 14 is, for example, $5\times10^{15}$ cm$^{-3}$ or more and $2\times10^{16}$ cm$^{-3}$ or less. A thickness of the drift region 14 is, for example, 5 μm or more and 100 μm or less.

In step S102, a first mask material is formed by being patterned by photolithography and etching. Aluminum as the p-type impurity is ion-implanted into the drift region 14 by using the first mask material as an ion implantation mask. The p-well region 16 is formed by ion implantation.

In step S104, a second mask material is formed by being patterned by the photolithography and the etching. The nitrogen as the n-type impurity is ion-implanted into the drift region 14 by using the second mask material as the ion implantation mask to form the source region 18.

In step S106, a third mask material is formed by being patterned by the photolithography and the etching. The aluminum as the p-type impurity is ion-implanted into the drift region 14 by using the third mask material as the ion implantation mask to form the p-well contact region 20.

In step S108, the first annealing is performed to activate the p-type impurity and the n-type impurity. The annealing is performed, for example, by using argon (Ar) gas as atmospheric gas under the condition that heating temperature is 1750° C. and heating time is 30 minutes.

In step S110, a silicon oxide layer 28 is formed. The silicon oxide layer 28 is formed at least on the p-well region 16 (silicon carbide layer). The silicon oxide layer 28 is formed by, for example, a chemical vapor deposition method (CVD Method). The silicon oxide layer 28 is formed of, for example, a so-called high temperature oxide (HTO) film. A thickness of the silicon oxide layer 28 is, for example, 20 nm or more and 150 nm or less.

For example, the carbon-carbon double bond is formed in the interface region 40 during the formation of the silicon oxide layer 28.

In step S112, the first termination treatment (first heat treatment) is performed. The first termination treatment is performed under the condition that the partial pressure of the ozone is 0.1% or more and 10% or less, or the partial pressure of the oxygen radical is 0.1% or more and 10% or less and the temperature is 400° C. or less. The temperature of the first termination treatment is, for example, 100° C. or more and 400° C. or less. If the temperature exceeds 400° C., the function of oxygen on the substrate becomes large, and if the ozone or oxygen radical is present, the substrate is oxidized. In the case of fluorine radical or hydrogen radical being applied, an Si—C bond in the substrate may be cut to form carbon defects in the substrate. Therefore, the condition of 400° C. or less is considered to be essential.

The diluent gas of the ozone or the oxygen radical is, for example, nitrogen ($N_2$), argon (Ar), helium (He) or the like. The helium as inert gas is a small element, and can be freely diffused in an insulating film. However, there is no function on an Si—O bond of the insulating film and an Si—C bond of the substrate, but on the other hand there is a function of exciting the carbon-carbon double bond on the interface. Therefore, it is possible to introduce the carbon-carbon double bond into the termination structure with good efficiency. In this sense, helium gas is most excellent as the diluent gas. Since radicals such as the oxygen radical are deactivated in the insulating film, it is effective when the thickness of the insulating film is less than 10 nm. For example, the first termination treatment is heat treatment at 300° C. for 1 hour under the atmosphere of 5% of ozone and 95% of argon. Alternatively, the first termination treatment is heat treatment at 300° C. for 10 minutes under the atmosphere of 5% of ozone and 95% of helium. When the helium is used as the diluent gas, the carbon-carbon double bond can be efficiently excited, such that almost all carbon-carbon double bonds can be terminated with oxygen by short-time annealing.

By the first termination treatment, the carbon-carbon double bond existing in the interface region 40 between the p-well region 16 and the silicon oxide layer 28 is converted into a single bond. In other words, a carbon-carbon n bond is terminated with oxygen.

In step S114, the gate electrode 30 is formed on the silicon oxide layer 28. For example, the gate electrode 30 is polycrystalline silicon including an n-type impurity or a p-type impurity.

In step S116, the interlayer insulating film 32 is formed on the gate electrode 30. The interlayer insulating film 32 is, for example, a silicon oxide film.

In step S118, the source electrode 34 is formed. The source electrode 34 is formed on the source region 18 and the p-well contact region 20. The source electrode 34 is formed by sputtering, for example, nickel (Ni) and aluminum (Al).

In step S120, the drain electrode 36 is formed. The drain electrode 36 is formed on the back surface of the silicon carbide layer 10. The drain electrode 36 is formed by sputtering, for example, nickel.

In step S122, to reduce a contact resistance between the source electrode 34 and the drain electrode 36, the second annealing is performed. The second annealing is performed at, for example, 400° C. or more and 1000° C. or less under the argon gas atmosphere.

By the above-mentioned manufacturing method, the MOSFET 100 shown in FIG. 1 is formed.

Next, the function and effect of the first embodiment will be described.

When the MOSFET is formed by using the silicon carbide, there is a problem in that the carrier mobility is reduced or a threshold voltage is fluctuated. An interface state between the silicon carbide layer and the gate insulating layer is considered to cause the reduction in the carrier mobility or the fluctuation in the threshold voltage.

For example, electrons traveling in the channel are trapped at the interface state between the silicon carbide layer and the gate insulating layer, such that the carrier mobility of the MOSFET is considered to be reduced. In addition, charges such as electrons and holes are trapped at the interface state between the silicon carbide layer and the gate insulating layer, such that the threshold voltage is considered to be fluctuated.

In the MOSFET 100 according to the first embodiment, since the number of carbon-carbon single bonds in the interface region 40 is larger than the number of carbon-carbon double bonds, the density of the interface state is reduced. As a result, the reduction in the carrier mobility of the MOSFET 100 and the fluctuation in the threshold voltage are suppressed.

In the manufacturing method of the MOSFET 100 according to the first embodiment, oxygen is supplied to the interface region 40 with ozone at a low partial pressure and a low temperature or oxygen radical at a low partial pressure and a low temperature, such that the carbon-carbon double bond in the interface region 40 is converted into the carbon-carbon single bond. As a result, it is possible to make the number of carbon-carbon single bonds larger than the number of carbon-carbon double bonds in the interface region 40. In addition, it is possible to convert almost all the carbon-carbon double bonds into the single bond without progressing the oxidation of the interface by performing the long-time treatment under the conditions of the first embodiment.

Figure 6A:
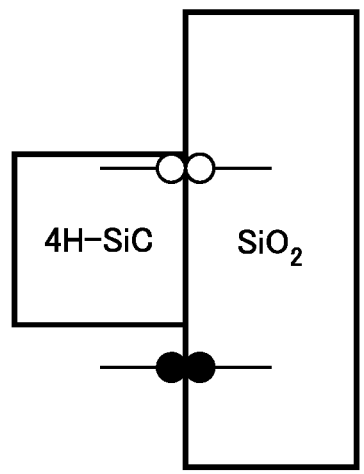
FIGS. 6A and 6B are diagrams for explaining a function and an effect of the first embodiment.
Figure 6B:
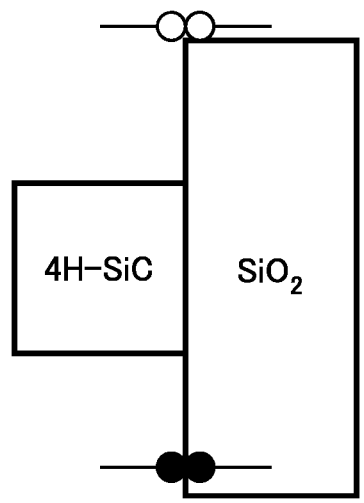

FIGS. 6A and 6B are diagrams for explaining the function and the effect of the first embodiment. FIG. 6A is a band diagram showing a carbon-carbon double bond in the interface region 40. FIG. 6B is a band diagram of a case where the carbon-carbon single bond exists in the interface region 40. FIGS. 6A and 6B are based on a first principle calculation of the inventor.

In the case where there is a carbon-carbon double bond in the interface region 40, as shown in FIG. 6A, an energy level at which electrons does not exist (shown by white circles in FIGS. 6A and 6B) and an energy level at which electrons are embedded (shown by black circles in FIGS. 6A and 6B) are generated. The energy level at which electrons does not exist is located near a lower end of a conduction band of 4H—SiC. In other words, an energy level at which electrons may be trapped exists in the interface region 40.

For example, electrons traveling in the channel may be trapped at the energy level at which electrons does not exist, and the carrier mobility of the MOSFET is considered to be reduced. Further, for example, electrons may be trapped at the energy level at which electrons does not exist, sand the threshold voltage is considered to be fluctuated.

When there is the carbon-carbon single bond in the interface region 40, as shown in FIG. 6B, the energy level at which electrons does not exist becomes shallower than the lower end of the conduction band of 4H—SiC and the lower end of the conduction band of the silicon oxide layer 28. In other words, the energy level at which electrons may be trapped does not exist in the interface region 40.

Therefore, when the carbon-carbon bond in the interface region 40 is the single bond, electrons traveling in the channel of the MOSFET are not trapped at the level in the interface region 40. Therefore, the reduction in the carrier mobility of the MOSFET is suppressed. In addition, the fluctuation in the threshold voltage of the MOSFET 100 is suppressed.

In the MOSFET 100 according to the first embodiment, the number of carbon-carbon single bonds in the interface region 40 is larger than the number of carbon-carbon double bonds in the interface region 40. Therefore, the decrease in the carrier mobility of the MOSFET 100 is suppressed. In addition, the fluctuation in the threshold voltage of the MOSFET 100 is suppressed. Therefore, the MOSFET 100 with improved characteristics is realized.

FIGS. 7A to 7F are diagrams for explaining the function of the manufacturing method according to the first embodiment.

When the silicon oxide layer 28 is formed on the silicon face of the silicon carbide layer 10, the carbon-carbon double bond is easily formed in the interface region 40 between the silicon carbide layer 10 and the silicon oxide layer 28. This is becoming clear by the first principle calculation.

Figure 7A:
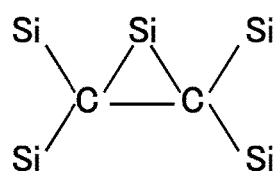
FIGS. 7A to 7F are diagrams for explaining a function of the manufacturing method according to the first embodiment.

Silicon is arranged on the outermost surface of the silicon face. Carbon is arranged at the lower layer of the silicon (FIG. 7A).

Figure 7D:
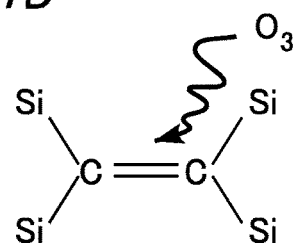
Figure 7B:
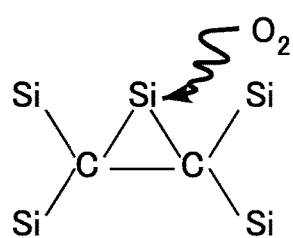

When the silicon oxide layer 28 is formed, oxygen is supplied to the silicon surface (FIG. 7B). In addition to the case in which the silicon oxide layer is formed by the thermal oxidation, oxygen is supplied to the silicon face also even in the case where the silicon oxide layer is formed by, for example, the CVD method.

Figure 7E:
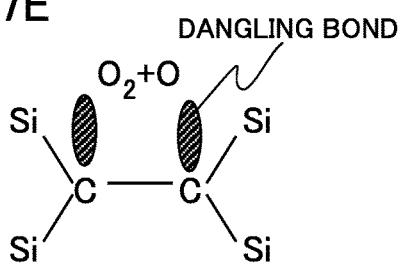
Figure 7C:
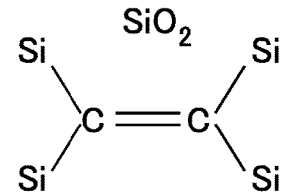

If oxygen is supplied to the silicon face, silicon and oxygen are bonded to form silicon oxide (FIG. 7C). In this case, two carbons bonded to silicon are bonded to each other by the double bond.

After the silicon oxide layer 28 is formed, for example, ozone is supplied to the interface between the silicon carbide layer 10 and the silicon oxide layer 28 (FIG. 7D).

The carbon-carbon double bond is broken due to the supply of the ozone, and a dangling bond of the carbon is generated (FIG. 7E).

Figure 7F:
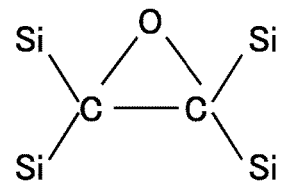

The oxygen and carbon of the ozone are bonded to each other to form a C—O—C structure (FIG. 7F). In other words, the dangling bond of the carbon is terminated by oxygen.

By the above function, the carbon-carbon double bond generated by the formation of the silicon oxide layer 28 is converted into the single bond by the first termination treatment.

According to the manufacturing method according to the first embodiment, it is possible to make the number of carbon-carbon single bonds larger than the number of carbon-carbon double bonds in the interface region 40. For this reason, it is possible to reduce the trap level in the interface region 40. Therefore, the decrease in the carrier mobility of the MOSFET 100 is suppressed. In addition, the fluctuation in the threshold voltage of the MOSFET 100 is suppressed. Therefore, the MOSFET 100 with improved characteristics is realized.

It is preferable that there is the larger number of carbon-carbon single bonds in the interface region 40 and the smaller number of carbon-carbon double bonds. It is preferable that the count number of photoelectrons due to the carbon-carbon single bond by the X-ray photoelectron spectroscopy is about 10 times or more larger than the number of photoelectrons due to the carbon-carbon double bond from the viewpoint of improving the characteristics of the MOSFET 100.

According to the manufacturing method according to the first embodiment, for example, in the peak measurement of C1s of the XPS, it is possible to increase the peak of the carbon-carbon single bond to the state where the peak of the carbon-carbon double bond becomes almost invisible. By performing the sufficient treatment, it is also possible to make existing carbon-carbon bond into the state of only the carbon-carbon single bond.

From the viewpoint of reducing the carbon-carbon double bond, in the peak measurement of the C1s of the XPS, a peak value of the carbon-carbon double bond may be preferably 10% or less of that of the carbon-carbon single bond, more preferably 2% or less, and still more preferably 1% or less.

In particular, the first termination element is preferably oxygen (O). In other words, it is preferable that the bonded state shown in FIG. 2B is used. The stability of the carbon-carbon single bond is improved by bonding the single-bonded carbon to oxygen.

In the MOSFET 100 according to the first embodiment, the insulating layer made of a material different from the silicon oxide layer 28 may be provided between the silicon oxide layer 28 and the gate electrode 30. The insulating layer may be formed of, for example, a silicon oxynitride film, a silicon nitride film, a hafnium oxide film, a hafnium oxynitride film, a hafnium silicate oxide film, a hafnium silicate oxynitride film, a zirconium oxide film, a zirconium oxynitride film, a zirconium silicate oxide film, a zirconium silicate oxynitride film, an aluminum oxide film, or an aluminum oxynitride film. Alternatively, the insulating layer may be a stacked film of these films.

In the manufacturing method according to the first embodiment, for example, the ozone or the oxygen radical is used for the first termination treatment. Since the stability of the carbon-carbon double bond is high, it is difficult to convert the double bond into the single bond in the oxidation using $O_2$. If, like ozone or oxygen radical, oxygen is dissociated to be an atomic form, the reaction with the n bond becomes easy. As a result, it is possible to convert the carbon-carbon double bond into the single bond.

If the partial pressure is too high, there is a risk that the oxidation of the silicon carbide layer 10 proceeds and a new double bond is formed. For this reason, the ozone or the oxygen radical is diluted so that the partial pressure is set to be 10% or less. The partial pressure of the ozone or the oxygen radical is preferably 5% or less, and preferably 3% or less.

In addition, if the heat treatment temperature is too high, there is a risk that the oxidation of the silicon carbide layer 10 proceeds and a new double bond is formed. For this reason, the heat treatment temperature is set to be 400° C. or less. The heat treatment temperature is preferably 300° C. or less. It is preferable that the heat treatment temperature is 100° C. or more from the viewpoint of converting the carbon-carbon double bond into the single bond.

When the first termination treatment is performed after the thick silicon oxide film, for example, the silicon oxide film of 10 nm or more is formed, it is preferable to use ozone. The ozone increases permeability of the silicon oxide film than that of the oxygen radical, and makes it easy to convert the carbon-carbon double bond into the single bond.

It is possible to use, for example, nitrogen (N), argon (Ar), or helium (He) for the diluent gas of the ozone or the oxygen radical. In particular, it is preferable to use helium (He) from the viewpoint of exciting the carbon-carbon double bond and improving the termination efficiency by the first termination element.

For the first termination treatment, in place of the oxygen radical, sulfur radical, selenium radical, tellurium radical, hydrogen radical, deuterium radical, or fluorine radical is used, such that the carbon-carbon n bond can be terminated by using oxygen (O), sulfur (S), selenium (Se), tellurium (Te), hydrogen (H), deuterium (D) or fluorine (F) as the first termination element.

In the manufacturing method according to the first embodiment, the case where the silicon oxide layer 28 is formed at one time by the CVD method and then the first termination treatment is performed is described as an example. However, the silicon oxide layer 28 can also be formed by other methods. For example, the silicon oxide layer 28 can be formed by the deposition of the silicon film and the thermal oxidation of the silicon film.

In addition, for example, a thin first silicon oxide film having a thickness of less than 10 nm is formed by the CVD method, and after the first termination treatment is performed, a thick second silicon oxide film can be formed by the CVD method. In particular, when the radical is used for the first termination treatment, a method for performing the first termination treatment after the thin first silicon oxide film having a thickness of less than 10 nm is formed, and then stacking a thick second silicon oxide film is preferable from the viewpoint of converting the double bond into the single bond.

As described above, according to the first embodiment, the improvement in the carrier mobility of the MOSFET 100 can be realized. In addition, the fluctuation in the threshold voltage of the MOSFET 100 is suppressed. Therefore, the MOSFET 100 with improved characteristics is realized.

Second Embodiment

A semiconductor device according to the second embodiment is different from the first embodiment in that it includes at least one second element selected from the group consisting of nitrogen (N), phosphorus (P), arsenic (As), antimony (Sb), bismuth (Bi), barium (Ba), boron (B), scandium (Sc), yttrium (Y), and lanthanoids (La, Ce, Pr, Nd, Pm, Sm, Eu, Gd, Tb, Dy, Ho, Er, Tm, Yb, Lu). Hereinafter, a description of contents overlapping with the first embodiment will be omitted.

A carbon (C)-carbon (C) bond exists in an interface region 40. The number of carbon-carbon single bonds in the interface region 40 is larger than the number of carbon-carbon double bonds in the interface region 40. The carbon-carbon double bond may not exist in the interface region 40.

The interface region 40 includes at least one second termination element (second element) selected from the group consisting of nitrogen (N), phosphorus (P), arsenic (As), antimony (Sb), bismuth (Bi), barium (Ba), boron (B), scandium (Sc), yttrium (Y), and lanthanoids (La, Ce, Pr, Nd, Pm, Sm, Eu, Gd, Tb, Dy, Ho, Er, Tm, Yb, Lu).

The second termination element substitutes silicon or carbon on an uppermost layer of a drift region 14 and a p-well region 16. Since the atoms on the uppermost layer are substituted, a second termination element becomes 3-coordinated with a silicon carbide layer 10. In other words, the second termination element is at a silicon location or a carbon location of a crystal lattice of the silicon carbide. In other words, the second termination element becomes 3-coordinated with the carbon atom of the silicon carbide layer 10 or 3-coordinated with the silicon atom of the silicon carbide layer 10. The second termination element terminates a dangling bond of the silicon or a dangling bond of the carbon on the uppermost layer of the drift region 14 and the p-well region 16.

Figure 8:
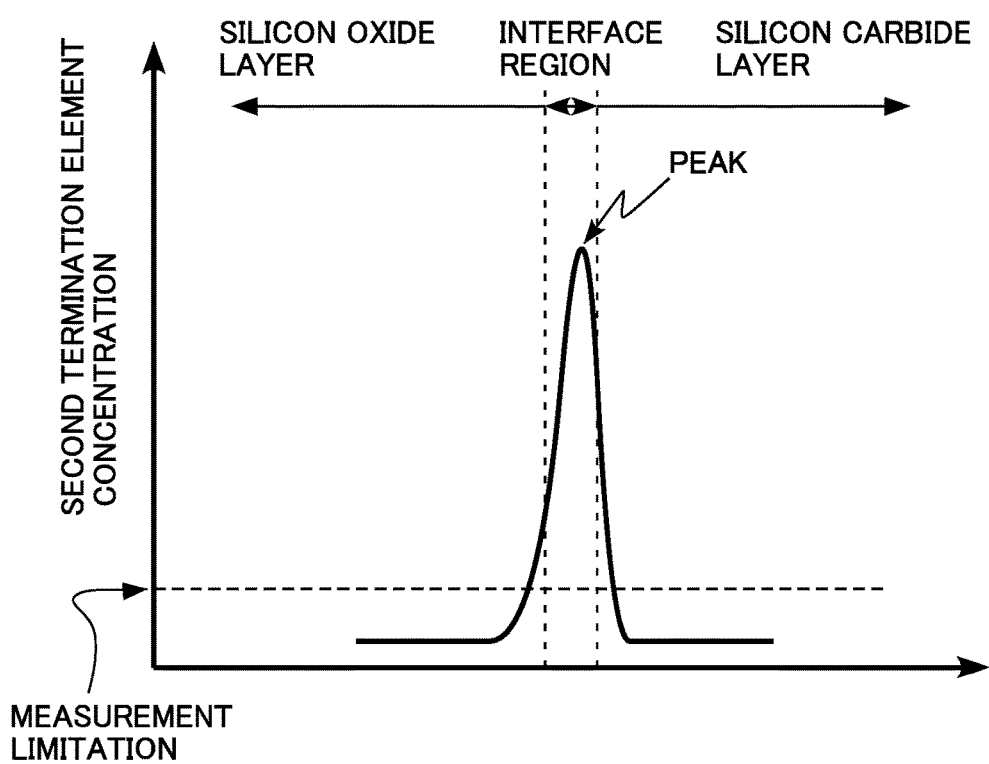
FIG. 8 is a graph showing a concentration distribution of a second termination element according to a second embodiment.

FIG. 8 is a diagram showing a concentration distribution of the second termination element according to the second embodiment.

The second termination element is segregated on an interface between the drift region 14 and the silicon oxide layer 28 and on interface between the p-well region 16 and the silicon oxide layer 28. A peak of the concentration distribution of the second termination element exists in the interface region 40.

A full width at half maximum with respect to the peak of the concentration distribution of the second termination element in the interface region 40 is, for example, 1 nm or less. In addition, the full width at half maximum with respect to the peak of the concentration distribution is preferably, for example, 0.25 nm or less and more preferably, less than 0.2 nm.

The peak of the concentration distribution of the second termination element in the interface region 40 is, for example, $4 \times 10^{16}$ cm$^{-3}$ or more and $7.5 \times 10^{21}$ cm$^{-3}$ or less. In addition, the peak of the concentration distribution of the second termination element is preferably, for example, $4 \times 10^{17}$ cm$^{-3}$ or more and $1.5 \times 10^{21}$ cm$^{-3}$ or less and more preferably $4 \times 10^{18}$ cm$^{-3}$ or more and $7.5 \times 10^{20}$ cm$^{-3}$ or less. Typically, the peak is $5 \times 10^{20}$ cm$^{-3}$.

The concentration and distribution of the second termination element in the interface region 40 can be measured by, for example, secondary ion mass spectroscopy (SIMS). In addition, the concentration and distribution of the second termination element can be specified by, for example, XPS, transmission electron microscope-energy dispersive X-ray spectroscopy (TEM-EDX), an atom probe, high resolution-Rutherford back scattering spectrometry (HR-RBS) or the like. In addition, a vibration mode can be observed by infrared spectroscopy and Raman spectroscopy, based on a structure in which the second termination element is 3-coordinated with the silicon carbide layer 10.

Next, a method for manufacturing a semiconductor device according to the second embodiment will be described. Hereinafter, the case where the first termination element is oxygen and the second termination element is nitrogen will be described by way of example.

The method for manufacturing a semiconductor device according to the second embodiment includes forming a silicon oxide layer on a front surface of the silicon carbide layer having a front surface inclined at 0° or more and 10° or less with respect to a (0001) face, performing second heat treatment under nitrogen-containing atmosphere, and performing first heat treatment at a partial pressure of ozone of 10% or less, a partial pressure of oxygen radical of 10% or less, and a temperature of 400° C. or less.

Figure 9:
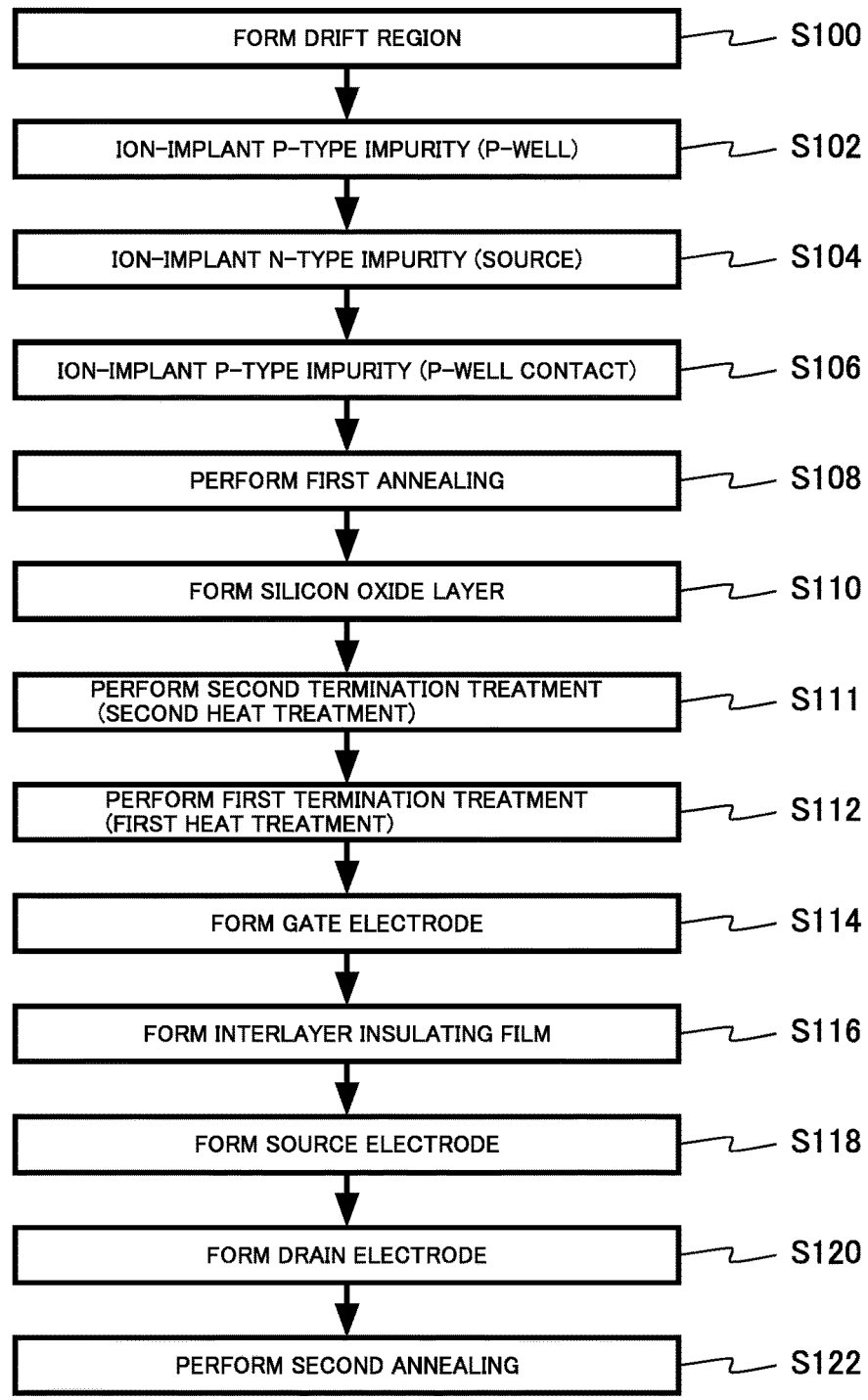
FIG. 9 is a process flow of a method for manufacturing a semiconductor device according to the second embodiment.

FIG. 9 is a process flow chart of the method for manufacturing a semiconductor device according to the second embodiment.

As shown in FIG. 9, the method for manufacturing a semiconductor device includes forming a drift region (step S100), ion-implanting a p-type impurity (step S102), ion-implanting an n-type impurity (step S104), ion-implanting a p-type impurity (step S106), performing first annealing (step S108), forming a silicon oxide layer (step S110), performing second termination treatment (second heat treatment) (step S111), performing first termination treatment (first heat treatment) (step S112), forming a gate electrode (step S114), forming an interlayer insulating film (step S116), forming a first electrode (step S118), forming a second electrode (step S120), and performing second annealing (step S122). The method for manufacturing a semiconductor device according to the second embodiment is the same as the method for manufacturing a semiconductor device according to the first embodiment except that it includes performing the second termination treatment (second heat treatment) (step S111).

In step S110, a silicon oxide layer 28 is formed. The silicon oxide layer 28 is formed at least on the p-well region 16 (silicon carbide layer). The silicon oxide layer 28 is formed, for example, by the CVD method. The silicon oxide layer 28 is formed as, for example, a so-called HTO film. A thickness of the silicon oxide layer 28 is, for example, 20 nm or more and 150 nm or less as a final film thickness. In the treatment using the radical, a film of, for example, 10 nm or less is treated so that the radical reaches the interface and is stacked.

In step S111, the second termination treatment (second heat treatment) is performed. The second termination treatment performs the heat treatment under the nitrogen containing atmosphere.

The second termination treatment is performed, for example, under the nitrogen atmosphere or the nitrogen oxide atmosphere. The temperature of the second termination treatment is, for example, 800° C. or more and 1400° C. or less. Typically, the condition of the second termination treatment is 100% of nitrogen monoxide (NO), 1175° C., and one hour.

By the second termination treatment, silicon or carbon existing in the interface region 40 between the p-well region 16 and the silicon oxide layer 28 is substituted by nitrogen. In other words, the dangling bond of the silicon or the dangling bond of the carbon is terminated by nitrogen.

In step S112, the first termination treatment (first heat treatment) is performed. The first termination treatment is performed under the condition that the partial pressure of the ozone is 10% or less, the partial pressure of the oxygen radical is 10% or less, and the temperature is 400° C. or less. The temperature of the first termination treatment is, for example, 100° C. or more and 400° C. or less.

Diluent gas of the ozone or the oxygen radical is, for example, nitrogen (N), argon (Ar), or helium (He). For example, the first termination treatment is heat treatment at 300° C. for 1 hour under the atmosphere of 5% of ozone and 95% of argon.

By the first termination treatment, the carbon-carbon double bond existing in the interface region 40 between the p-well region 16 and the silicon oxide layer 28 is converted into the single bond. In other words, a carbon-carbon n bond is terminated.

Next, the function and effect of the second embodiment will be described.

When the MOSFET is formed by using the silicon carbide, there is a problem in that the carrier mobility is reduced or a threshold voltage is fluctuated. An interface state between the silicon carbide layer and the gate insulating layer is considered to cause the reduction in the carrier mobility or the fluctuation in the threshold voltage.

For example, electrons traveling in the channel are trapped at the interface state between the silicon carbide layer and the gate insulating layer, such that the carrier mobility of the MOSFET is considered to be reduced. In addition, charges such as electrons and holes are trapped at the interface state between the silicon carbide layer and the gate insulating layer, such that the threshold voltage is considered to be fluctuated.

As described in the first embodiment, an interface state between the silicon carbide layer and the gate insulating layer is generated by the carbon-carbon double bond in the interface region 40. In addition, the interface state between the silicon carbide layer and the gate insulating layer is considered to be generated by the dangling bond of the silicon or the dangling bond of the carbon in the interface region 40.

Similar to the first embodiment, in the MOSFET according to the second embodiment, since the number of carbon-carbon single bonds in the interface region 40 is larger than the number of carbon-carbon double bonds, the density of the interface state is reduced. In addition, since the dangling bond of the silicon or the dangling bond of the carbon in the interface region 40 is terminated by the second termination element, the density of the interface state is further reduced. Therefore, the reduction in the carrier mobility of the MOSFET and the fluctuation in the threshold voltage are further suppressed.

It is preferable that the second termination element is nitrogen (N). The structure in which the dangling bond of the silicon or the dangling bond of the carbon is terminated by using nitrogen as the second termination element is stabilized.

A full width at half maximum with respect to a peak of the concentration distribution of the second termination element in the interface region 40 is preferably 0.25 nm or less, and more preferably less than 0.2 nm.

In addition, the peak of the concentration distribution of the second termination element in the interface region 40 is preferably, for example, $4 \times 10^{17}$ cm$^{-3}$ or more and $1.5 \times 10^{21}$ cm$^{-3}$ or less and more preferably $4 \times 10^{18}$ cm$^{-3}$ or more and $7.5 \times 10^{20}$ cm$^{-3}$ or less.

In the manufacturing method according to the second embodiment, the second termination treatment is performed before the first termination treatment. In other words, the structure in which the dangling bond of the silicon or the dangling bond of the carbon is terminated is formed and then the structure in which the carbon-carbon n bond is terminated is formed. By the manufacturing method, it is possible to make the number of carbon-carbon single bonds larger than the number of carbon-carbon double bonds in the interface region 40.

If the dangling bond of the silicon or the dangling bond of the carbon exists in the interface region 40, the oxidation of the silicon carbide layer 10 easily proceeds. For this reason, if the second termination treatment is not performed ahead of the first termination treatment, there is the possibility that the oxidation proceeds by the oxygen in the atmosphere of the first termination treatment and a new carbon-carbon double bond is generated. In other words, it is difficult to make the number of carbon-carbon single bonds larger than the number of carbon-carbon double bonds in the interface region 40 by the first termination treatment.

In the manufacturing method according to the second embodiment, for example, the thin first silicon oxide film can be formed by the CVD method, the second termination treatment and the first termination treatment can be performed, and then the thick second silicon oxide film can be formed by the CVD method. In this case, the silicon oxide layer 28 becomes a stacked film of the first silicon oxide film and the second silicon film.

As described above, according to the second embodiment, the dangling bond of the silicon or the dangling bond of the carbon is terminated, such that it is possible to further improve the carrier mobility of the MOSFET. In addition, the fluctuation in the threshold voltage of the MOSFET is further suppressed. Therefore, the MOSFET with the further improved characteristics is realized.

Third Embodiment

A semiconductor device according to a third embodiment is different from the first or second embodiment in that an interface region is provided in a termination region of a MOSFET. A description overlapping with the first or second embodiment will be omitted.

Figure 10:
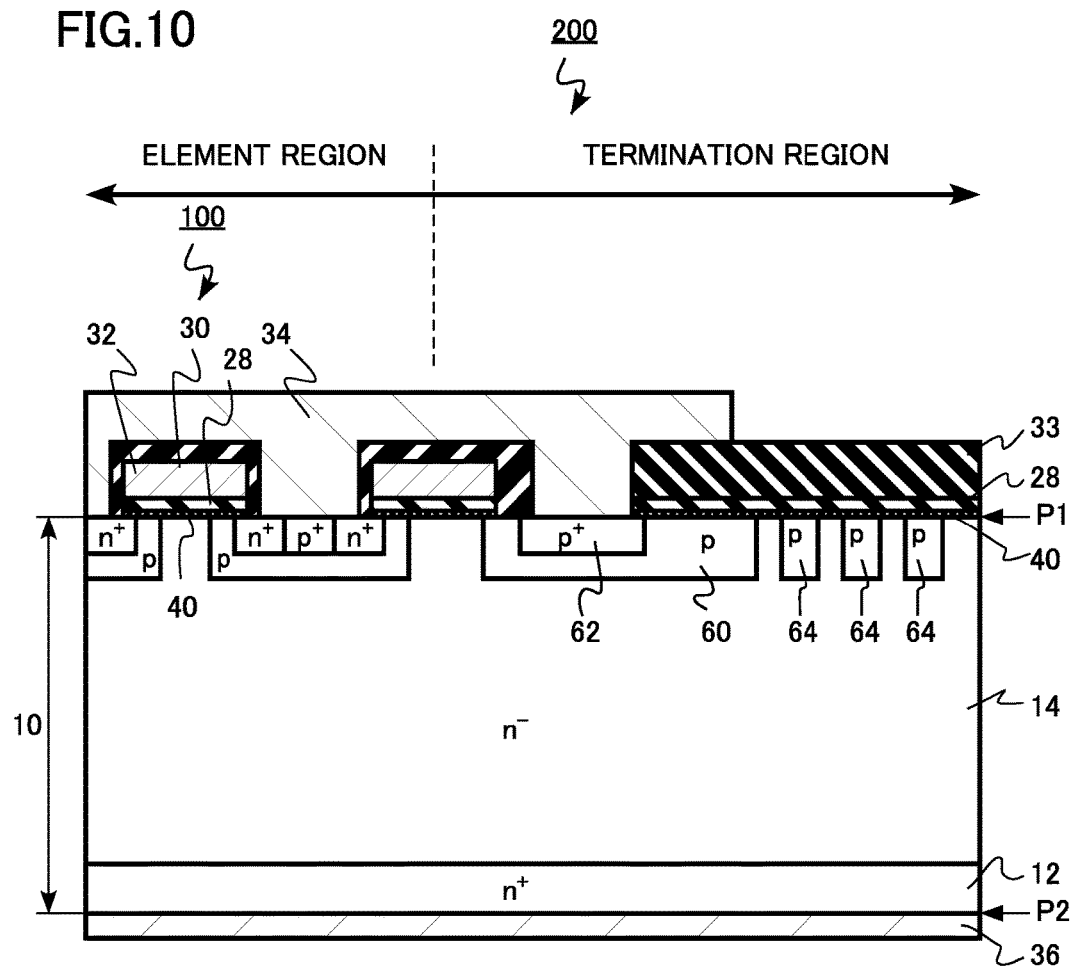
FIG. 10 is a schematic cross-sectional view of a semiconductor device according to a third embodiment.

FIG. 10 is a schematic cross-sectional view showing a configuration of a MOSFET 200 which is a semiconductor device according to the third embodiment. The MOSFET 200 includes an element region and a termination region provided around the element region.

For example, the MOSFET 100 according to the first or second embodiment is disposed in the element region as a unit cell. The termination region has a function of improving a breakdown voltage of the MOSFET 200.

The termination region includes a p-type reduced surface field (RESURF) region 60, a p+-type contact region 62, a p-type guard ring region 64, an interface region 40, a silicon oxide layer 28, and a field oxide film 33. The interface region 40 is provided between a surface of the p-type RESURF region 60 and the p-type guard ring region 64, and the field oxide film 33.

The configuration of the interface region 40 and the silicon oxide layer 28 is the same as in the first or second embodiment.

The field oxide film 33 is, for example, a silicon oxide film.

When the MOSFET 200 is turned off, a depletion layer is formed in the RESURF region 60, the guard ring regions 64, and a drift region 14 between the guard ring regions 64, thereby improving the breakdown voltage of the MOSFET 200.

However, if an interface state exists at an interface between the RESURF region 60 and the guard ring region 64, and the field oxide film 33, charges are trapped at the interface state. There is a risk that the desired depletion layer may not be formed due to an electric field of the trapped charge. In this case, the breakdown voltage of the MOSFET 200 degrades.

According to the third embodiment, the interface region 40 is provided, and thus the interface state is terminated. As a result, the desired depletion layer is formed, and thus MOSFET 200 with the stable breakdown voltage is realized.

Fourth Embodiment

An inverter circuit and a driving device according to a fourth embodiment are the driving device including the semiconductor device according to the first embodiment.

Figure 11:
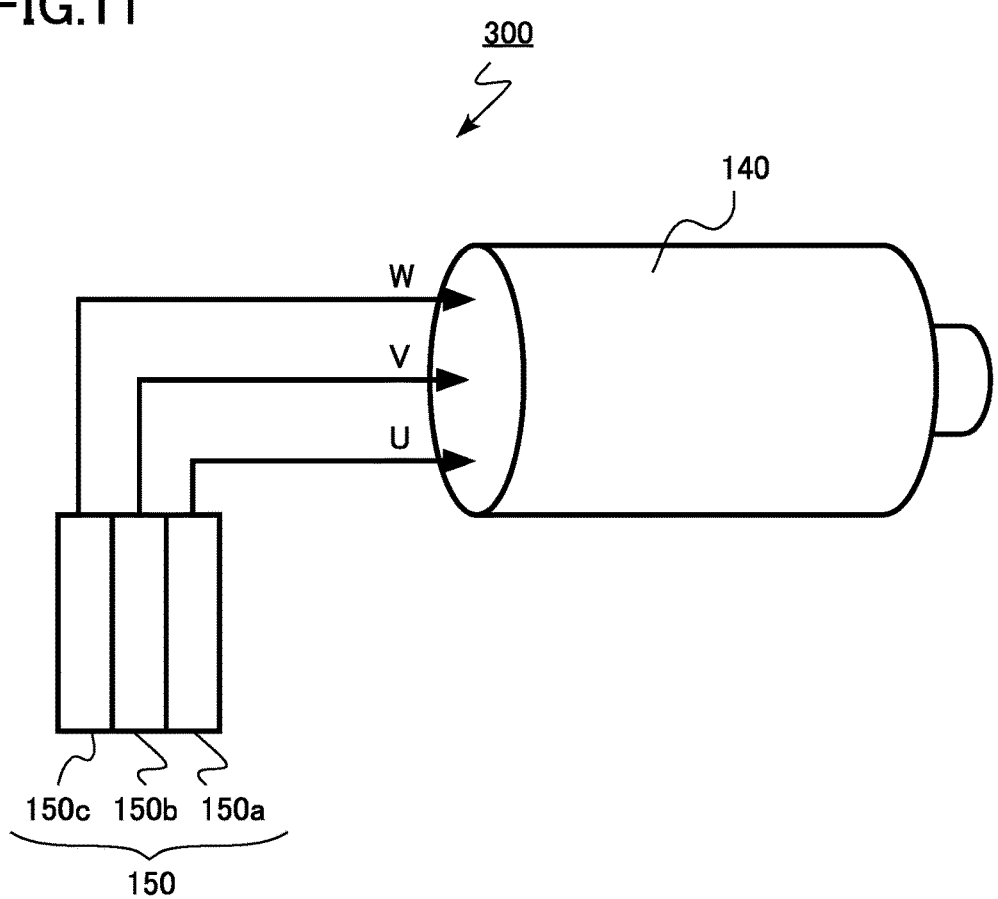
FIG. 11 is a schematic diagram of a driving device according to a fourth embodiment.

FIG. 11 is a schematic diagram of the driving device according to the fourth embodiment. The driving device 300 includes a motor 140 and an inverter circuit 150.

The inverter circuit 150 includes three semiconductor modules 150a, 150b, and 150c having the MOSFET 100 according to the first embodiment as a switching element. The three semiconductor modules 150a, 150b, and 150c are connected in parallel, such that a three-phase inverter circuit 150 having three AC voltage output terminals U, V and W is realized. The motor 140 is driven by the AC voltage output from the inverter circuit 150.

According to the fourth embodiment, characteristics of the inverter circuit 150 and the driving device 300 are improved by providing the MOSFET 100 with improved characteristics.

Fifth Embodiment

A vehicle according to a fifth embodiment is a vehicle including the semiconductor device according to the first embodiment.

Figure 12:
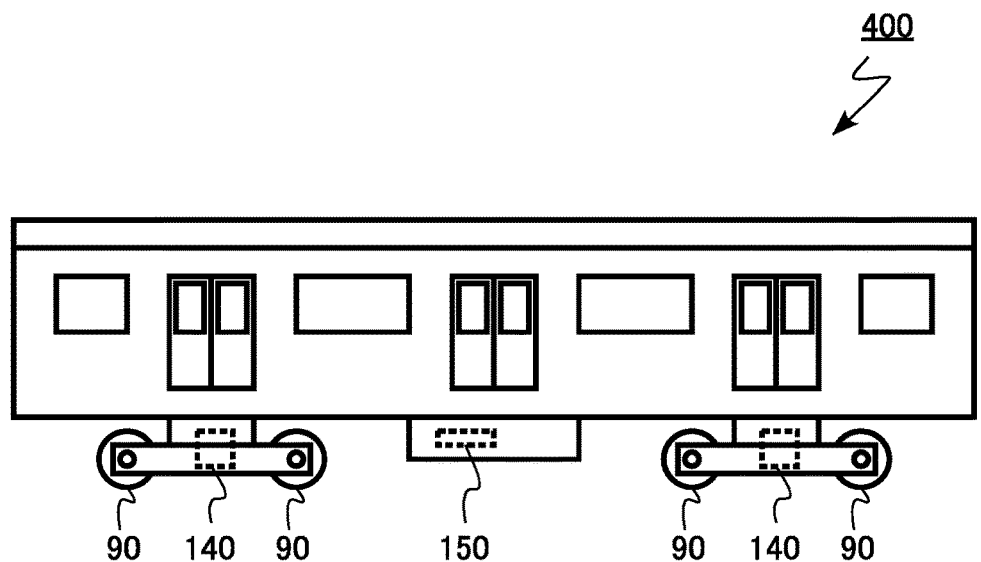
FIG. 12 is a schematic diagram of a vehicle according to a fifth embodiment.

FIG. 12 is a schematic diagram of the vehicle according to the fifth embodiment. A vehicle 400 according to the fifth embodiment is a railway car. The vehicle 400 includes a motor 140 and an inverter circuit 150.

The inverter circuit 150 includes three semiconductor modules using the MOSFET 100 according to the first embodiment as a switching element. Three semiconductor modules are connected in parallel, and thus a three-phase inverter circuit 150 including three AC voltage output terminals U, V, and W is realized. The motor 140 is driven by the AC voltage output from the inverter circuit 150. A wheel 90 of the vehicle 400 rotates by the motor 140.

According to the fifth embodiment, the MOSFET 100 with improved characteristics is provided, and thus characteristics of the vehicle 400 are improved.

Sixth Embodiment

A vehicle according to a sixth embodiment is a vehicle including the semiconductor device according to the first embodiment.

Figure 13:
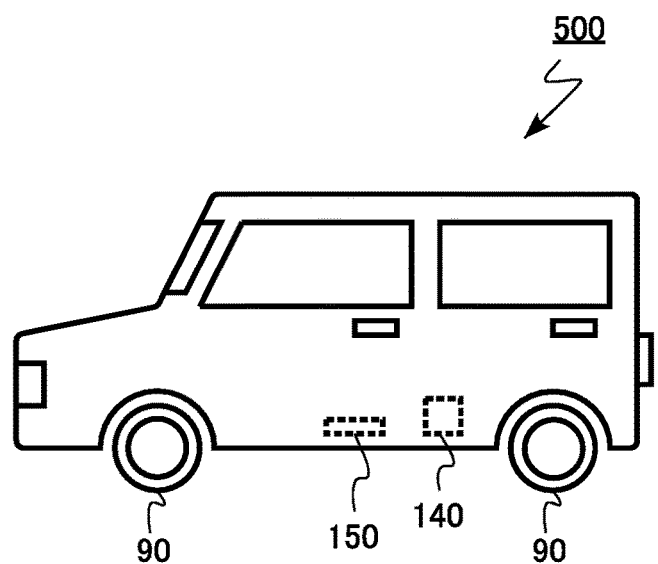
FIG. 13 is a schematic diagram of a vehicle according to a sixth embodiment.

FIG. 13 is a schematic diagram of the vehicle according to the sixth embodiment. A vehicle 500 according to the sixth embodiment is a car. The vehicle 500 includes a motor 140 and an inverter circuit 150.

The inverter circuit 150 includes three semiconductor modules using the MOSFET 100 according to the first embodiment as a switching element. Three semiconductor modules are connected in parallel, and thus a three-phase inverter circuit 150 including three AC voltage output terminals U, V, and W is realized.

The motor 140 is driven by the AC voltage output from the inverter circuit 150. A wheel 90 of the vehicle 500 rotates by the motor 140.

According to the sixth embodiment, the MOSFET 100 with improved characteristics is provided, and thus characteristics of the vehicle 500 are improved.

Seventh Embodiment

An elevator according to a seventh embodiment is an elevator including the semiconductor device according to the first embodiment.

Figure 14:
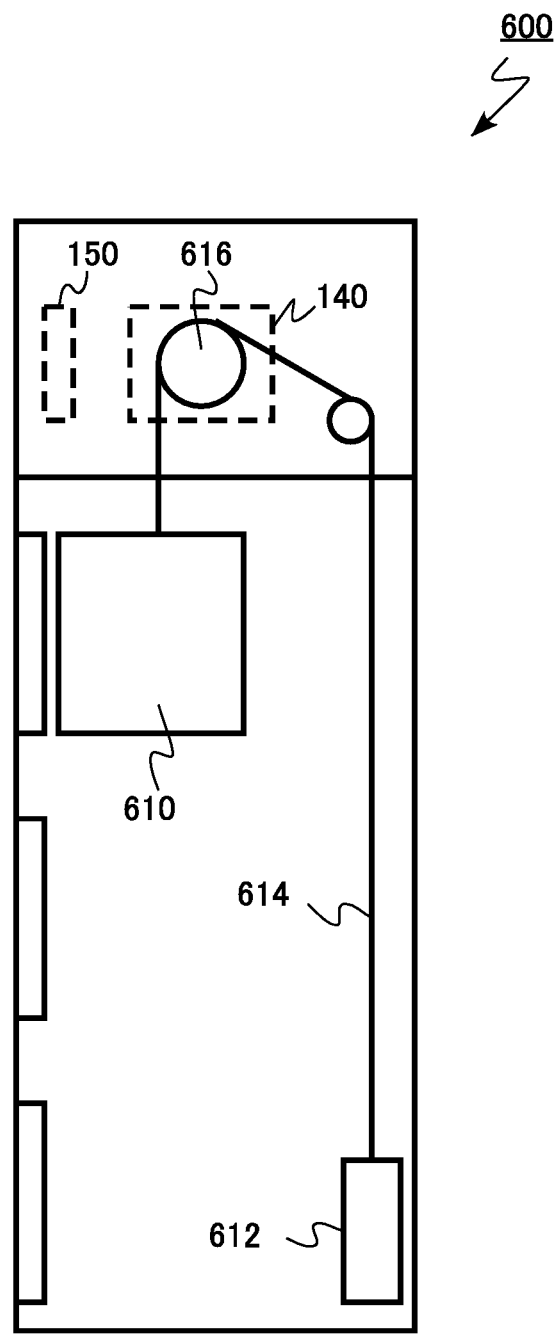
FIG. 14 is a schematic diagram of an elevator according to a seventh embodiment.

FIG. 14 is a schematic diagram of the elevator according to the seventh embodiment. An elevator 600 according to the seventh embodiment includes a car 610, a counterweight 612, a wire rope 614, a hoisting machine 616, a motor 140, and an inverter circuit 150.

The inverter circuit 150 includes three semiconductor modules using the MOSFET 100 according to the first embodiment as a switching element. Three semiconductor modules are connected in parallel, and thus a three-phase inverter circuit 150 including three AC voltage output terminals U, V, and W is realized.

The motor 140 is driven by the AC voltage output from the inverter circuit 150. The hoisting machine 616 rotates by the motor 140 to elevate the car 610.

According to the seventh embodiment, the MOSFET 100 with improved characteristics is provided, and thus characteristics of the elevator 600 are improved.

As described above, in the first embodiment, the case of 4H—SiC as a crystal structure of silicon carbide has been described byway of example, but the present disclosure can be applied to the silicon carbide having other crystal structures such as 6H—SiC and 3C—SiC.

In the first embodiment, an n-channel type planar type MOSFET has been described as an example, but the present disclosure can also be applied to an n-channel type trench type MOSFET. In this case, for example, a side surface of the trench is a silicon face.

The present disclosure can also be applied to an n channel type insulated gate bipolar transistor (IGBT).

In addition, the present disclosure is not limited to the n-channel type but can also be applied to a p-channel type MOSFET or an IGBT.

In addition, in the fifth to seventh embodiments, the case where the semiconductor device of the present disclosure is applied to the vehicle or the elevator has been described byway of example, but the semiconductor device of the present disclosure may be applied to, for example, a power conditioner of a solar power generation system or the like.

While certain embodiments have been described, these embodiments have been presented byway of example only, and are not intended to limit the scope of the inventions. Indeed, the semiconductor device, the method for manufacturing a semiconductor device, the inverter circuit, the driving device, the vehicle described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a silicon carbide layer having a front surface inclined at 0° or more and 10° or less with respect to a (0001) face;
   a silicon oxide layer; and
   a region located between the front surface and the silicon oxide layer and having the number of carbon-carbon single bonds larger than the number of carbon-carbon double bonds.

2. The semiconductor device according to claim 1, wherein the region includes a structure in which one first element selected from the group consisting of oxygen (O), sulfur (S), selenium (Se), and tellurium (Te) is bonded to both of two single-bonded carbons.

3. The semiconductor device according to claim 1, wherein the region includes a structure in which a first element selected from the group consisting of hydrogen (H), deuterium (D), and fluorine (F) is bonded to each of two single-bonded carbons one by one.

4. The semiconductor device according to claim 1, wherein the region includes at least one second element selected from the group consisting of nitrogen (N), phosphorus (P), arsenic (As), antimony (Sb), bismuth (Bi), barium (Ba), boron (B), scandium (Sc), yttrium (Y), and lanthanoids (La, Ce, Pr, Nd, Pm, Sm, Eu, Gd, Tb, Dy, Ho, Er, Tm, Yb, Lu).

5. The semiconductor device according to claim 4, wherein the region includes a peak of a concentration distribution of the at least one second element.

6. The semiconductor device according to claim 5, wherein the peak of the concentration distribution of the at least one second element is $4 \times 10^{16}$ cm$^{-3}$ or more and $7.5 \times 10^{21}$ cm$^{-3}$ or less.

7. The semiconductor device according to claim 5, wherein a full width at half maximum of the concentration distribution of the at least one second element is 1 nm or less.

8. The semiconductor device according to claim 1, further comprising: a gate electrode, the silicon oxide layer being located between the gate electrode and the silicon carbide layer.

9. A semiconductor device, comprising:
   a silicon carbide layer having a first plane and a second plane, the first plane being inclined at 0° or more and 10° or less with respect to a (0001) face;
   a first electrode contacting the first plane;
   a second electrode contacting the second plane;
   a first-conductivity type first semiconductor region located in the silicon carbide layer;
   a second-conductivity type second semiconductor region located between the first semiconductor region and the first plane;
   a first-conductivity type third semiconductor region located between the second semiconductor region and the first plane;
   a gate electrode;
   a silicon oxide layer located between the second semiconductor region and the gate electrode; and
   a region located between the second semiconductor region and the silicon oxide layer and having the number of carbon-carbon single bonds larger than the number of carbon-carbon double bonds.

10. The semiconductor device according to claim 9, wherein the region includes a structure in which one first element selected from the group consisting of oxygen (O), sulfur (S), selenium (Se), and tellurium (Te) is bonded to both of two single-bonded carbons.

11. The semiconductor device according to claim 9, wherein the region includes a structure in which a first element selected from the group consisting of hydrogen (H), deuterium (D), and fluorine (F) is bonded to each of two single-bonded carbons one by one.

12. The semiconductor device according to claim 9, wherein the region includes at least one second element selected from the group consisting of nitrogen (N), phosphorus (P), arsenic (As), antimony (Sb), bismuth (Bi), barium (Ba), boron (B), scandium (Sc), yttrium (Y), and lanthanoids (La, Ce, Pr, Nd, Pm, Sm, Eu, Gd, Tb, Dy, Ho, Er, Tm, Yb, Lu).

13. The semiconductor device according to claim 12, wherein the region includes a peak of a concentration distribution of the at least one second element.

14. An inverter circuit comprising the semiconductor device according to claim 1.

15. A driving device comprising the semiconductor device according to claim 1.

16. A vehicle comprising the semiconductor device according to claim 1.

17. An elevator comprising the semiconductor device according to claim 1.

* * * * *